(12) United States Patent
Kwon

(10) Patent No.: US 11,550,492 B2
(45) Date of Patent: Jan. 10, 2023

(54) SEMICONDUCTOR MEMORY DEVICE, CONTROLLER, AND MEMORY SYSTEM HAVING SEMICONDUCTOR MEMORY DEVICE AND CONTROLLER

(71) Applicant: SK hynix Inc., Gyeonggi-do (KR)

(72) Inventor: Jae Kwan Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/204,152

(22) Filed: Mar. 17, 2021

(65) Prior Publication Data

US 2022/0083253 A1 Mar. 17, 2022

(30) Foreign Application Priority Data

Sep. 16, 2020 (KR) .................. 10-2020-0119015

(51) Int. Cl.
*G06F 3/00* (2006.01)
*G06F 3/06* (2006.01)
(Continued)

(52) U.S. Cl.
CPC .......... *G06F 3/0653* (2013.01); *G06F 3/0604* (2013.01); *G06F 3/0634* (2013.01);
(Continued)

(58) Field of Classification Search
CPC ..... G11C 16/26; G11C 16/10; G11C 11/5642; G11C 16/14; G11C 16/0483; G11C 16/16; G11C 16/30; G11C 11/5628; G11C 16/3404; G11C 29/021; G11C 29/028; G11C 11/56; G11C 16/06; G11C 16/08; G11C 16/28; G11C 16/3445; G11C 5/144; G11C 11/5671; G11C 13/0033; G11C 13/0035; G11C 13/004; G11C 16/12; G11C 16/225; G11C 16/32; G11C 16/34; G11C 16/3418; G11C 16/3422; G11C 16/3436; G11C 16/3495; G11C 2013/0057; G11C 2211/5641; G11C 29/52; G11C 7/02; G11C 7/04; G06F 3/0604; G06F 3/0659;
(Continued)

(56) References Cited

U.S. PATENT DOCUMENTS 10,437,518 B2 * 10/2019 Park ..................... G06F 3/0619

FOREIGN PATENT DOCUMENTS

KR 10-2019-0035280 4/2019
KR 10-2019-0040604 4/2019

* cited by examiner

*Primary Examiner* — Thong Q Le
(74) *Attorney, Agent, or Firm* — IP & T Group LLP

(57) ABSTRACT

Provided herein may be a semiconductor memory device, a controller, and a memory system having the same. By means of a method of operating the controller of the memory system, the semiconductor memory device, which is included in the memory system and including a plurality of memory blocks, is controlled. The method of operating the controller may include sensing a power-on state of the memory system, and performing an erased block scan operation on the plurality of memory blocks using a scan read voltage, based on sensing that the memory system is in the power-on state. Each of memory cells in the plurality of memory blocks may store at least two bits of data, and the scan read voltage may enable an erase state and a program state of the memory cells to be distinguished from each other.

18 Claims, 22 Drawing Sheets

(51) Int. Cl.
*G11C 16/10* (2006.01)
*G11C 16/04* (2006.01)
*G11C 16/14* (2006.01)
*G11C 16/26* (2006.01)
*G11C 11/56* (2006.01)

(52) U.S. Cl.
CPC .......... *G06F 3/0659* (2013.01); *G06F 3/0673* (2013.01); *G11C 11/56* (2013.01); *G11C 16/0483* (2013.01); *G11C 16/10* (2013.01); *G11C 16/14* (2013.01); *G11C 16/26* (2013.01)

(58) Field of Classification Search
CPC ............... G06F 11/076; G06F 11/1012; G06F 11/1068; G06F 11/1441; G06F 11/1489; G06F 11/3034; G06F 11/3037; G06F 11/3062; G06F 3/0619; G06F 3/0634; G06F 3/0653; G06F 3/0673; G06F 3/0679; G06F 11/0727; G06F 12/0246; G06F 13/1673; G06F 13/4068; G06F 2212/7201; G06F 2212/7209; G06F 3/0655; G06F 3/0658; G06F 3/0688
See application file for complete search history.

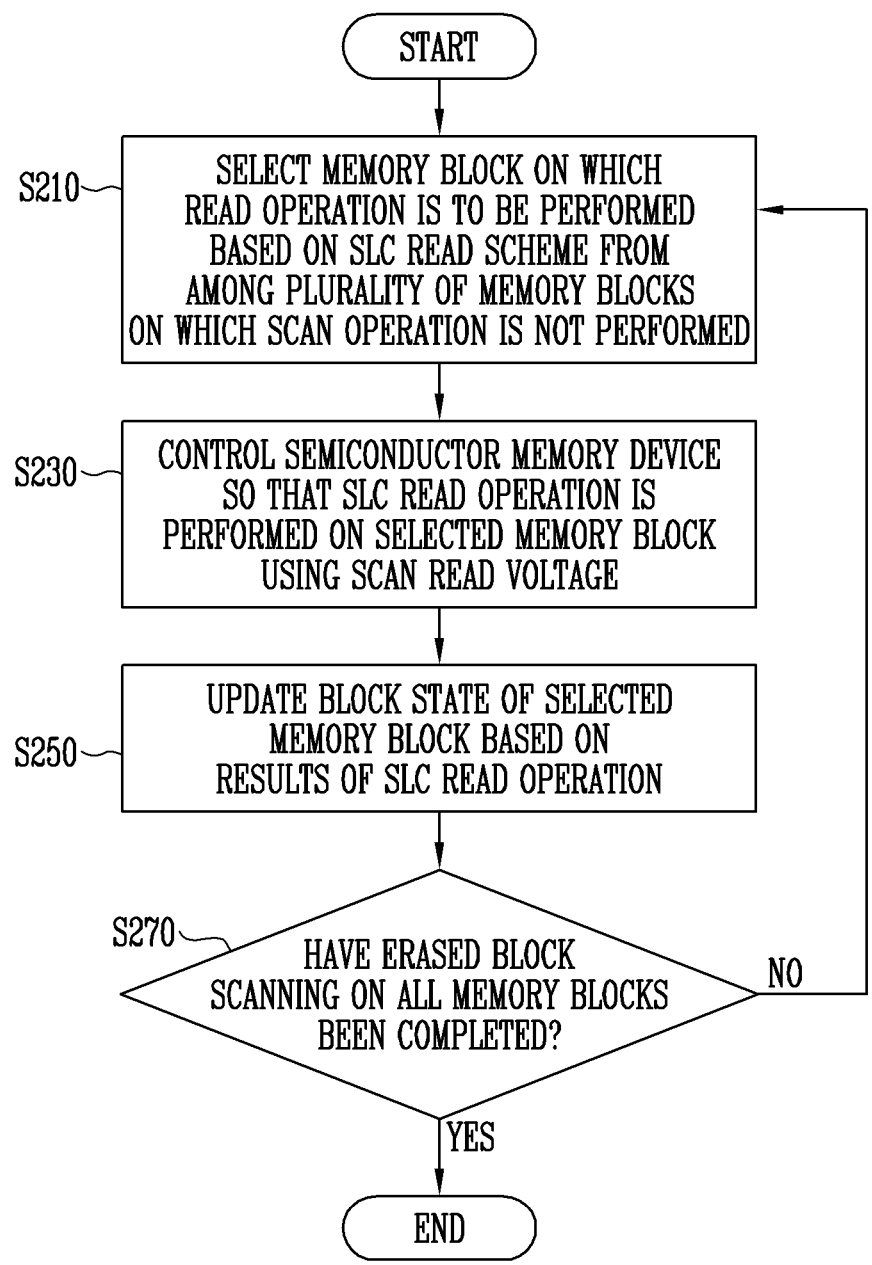

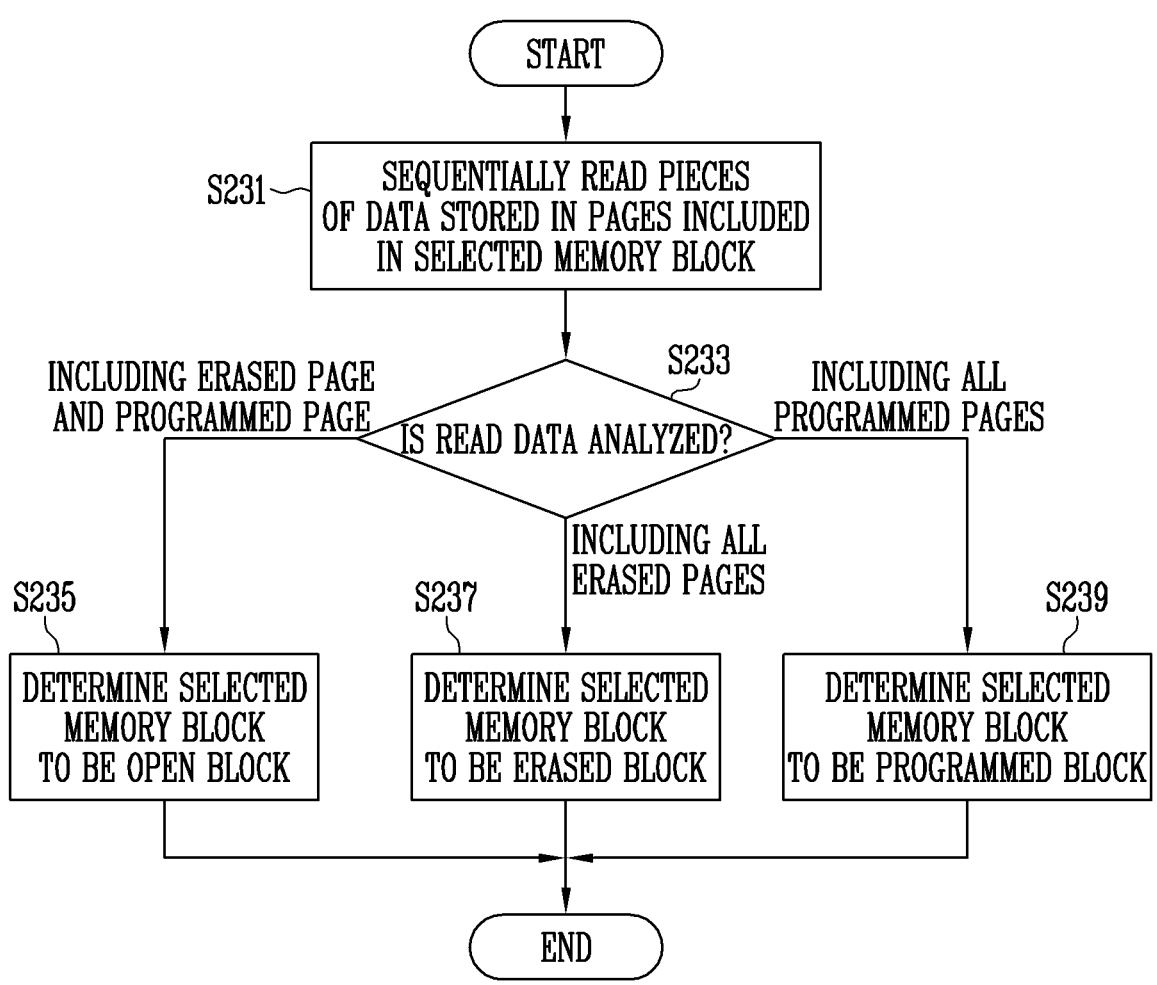

| |
|---|
| Page1 |
| Page2 |
| Page3 |
| Page4 |
| Page5 |
| Page6 |
| Page7 |
| Page8 |
| Page9 |
| Page10 |
| Page11 |
| Page12 |
| Page13 |
| Page14 |
| Page15 |
| Page16 |

☐ Erased Page

Programmed Page

| Page1 |
| Page2 |
| Page3 |
| Page4 |
| Page5 |
| Page6 |
| Page7 |
| Page8 |
| Page9 |
| Page10 |
| Page11 |
| Page12 |
| Page13 |
| Page14 |
| Page15 |
| Page16 |

☐ Erased Page

Programmed Page

| Page1 |
| Page2 |
| Page3 |
| Page4 |
| Page5 |
| Page6 |
| Page7 |
| Page8 |
| Page9 |
| Page10 |
| Page11 |
| Page12 |
| Page13 |
| Page14 |
| Page15 |
| Page16 |

☐ Erased Page

Programmed Page

SEMICONDUCTOR MEMORY DEVICE, CONTROLLER, AND MEMORY SYSTEM HAVING SEMICONDUCTOR MEMORY DEVICE AND CONTROLLER

CROSS-REFERENCE TO RELATED APPLICATION

The present application claims priority under 35 U.S.C. § 119(a) to Korean patent application number 10-2020-0119015, filed on Sep. 16, 2020, in the Korean Intellectual Property Office, the entire disclosure of which is incorporated by reference herein.

BACKGROUND

1. Technical Field

Various embodiments of the present disclosure relate to an electronic device, and more particularly, to a semiconductor memory device, a controller, and a memory system having the semiconductor memory device and the controller.

2. Related Art

A semiconductor memory device may have a two-dimensional (2D) structure in which strings are horizontally arranged on a semiconductor substrate. In response to the 2D semiconductor memory device reaching its physical scaling limit (i.e., limit in the degree of integration), a three-dimensional (3D) semiconductor memory device including a plurality of memory cells vertically stacked on a semiconductor substrate has been produced.

A controller may control the operation of the semiconductor memory device.

SUMMARY

Various embodiments of the present disclosure are directed to a semiconductor memory device having an improved operation speed, a controller, and a memory system having the semiconductor memory device and the controller.

An embodiment of the present disclosure may provide for a method of operating a controller of a memory system and that controls a semiconductor memory device including a plurality of memory blocks. The method of operating the controller may include sensing a power-on state of the memory system, and performing an erased block scan operation on the plurality of memory blocks using a scan read voltage, based on sensing that the memory system is in the power-on state. Each of memory cells in the plurality of memory blocks may store at least two bits of data. The scan read voltage may enable an erase state and a program state of the memory cells to be distinguished from each other.

In an embodiment, performing the erased block scan operation on the plurality of memory blocks using the scan read voltage may include selecting a memory block on which the erased block scan operation has not been performed from among the plurality of memory blocks, controlling the semiconductor memory device so that a single-level cell (SLC) read operation is performed on the selected memory block using the scan read voltage, and updating a block state of the selected memory block based on a result of the SLC read operation.

In an embodiment, controlling the semiconductor memory device so that the SLC read operation is performed on the selected memory block using the scan read voltage may include controlling the semiconductor memory device so that pieces of data stored in a plurality of pages in the selected memory block are sequentially read using the scan read voltage, and analyzing the read data.

In an embodiment, the method may further include determining the selected memory block to be a programmed block in response to a result of the analyzing indicating that all pages in the selected memory block are programmed pages.

In an embodiment, the method may further include determining the selected memory block to be an erased block in response to a result of the analyzing indicating that all pages in the selected memory block are erased pages.

In an embodiment, the method may further include determining the selected block to be an open block in response to a result of the analyzing indicating that both a programmed page and an erased page are included in the selected memory block.

An embodiment of the present disclosure may provide a method of operating a semiconductor memory device including a plurality of memory blocks, each of which includes a plurality of memory cells, each storing at least two bits of data. The method of operating the semiconductor memory device may include receiving a read command from a controller, checking a type of the received read command, and performing a data read operation on a page corresponding to the read command by selectively using a scan read voltage or a normal read voltage set based on the type of the read command.

In an embodiment, the method may further include transferring the read data to the controller.

In an embodiment, performing the data read operation on the page corresponding to the read command by selectively using the scan read voltage or the normal read voltage set based on the type of the read command may include reading data from a page corresponding to the read command using the scan read voltage in response to a determination indicating that the type of the read command is a single-level cell (SLC) read command.

In an embodiment, the scan read voltage may enable an erase state and at least one program state of the memory cells to be distinguished from each other.

In an embodiment, performing the data read operation on the page corresponding to the read command by selectively using the scan read voltage or the normal read voltage set based on the type of the read command may include reading data from a page corresponding to the read command using the normal read voltage set in response to a determination indicating that the type of the read command is a normal read command.

In an embodiment, each of the plurality of memory cells may store two bits of data, and the normal read voltage set may be at least one of a first read voltage set for reading least significant bit (LSB) page data stored in the selected page and a second read voltage set for reading most significant bit (MSB) page data stored in the selected page.

In an embodiment, each of the plurality of memory cells may store three bits of data, and the normal read voltage set is at least one of a first read voltage set for reading least significant bit (LSB) page data stored in the selected page, a second read voltage set for reading central significant bit (CSB) page data stored in the selected page, and a third read voltage set for reading most significant bit (MSB) page data stored in the selected page.

An embodiment of the present disclosure may provide for a memory system. The memory system may include a semiconductor memory device and a controller. The semiconductor memory device may include a plurality of memory blocks, each of which includes a plurality of memory cells, each storing at least two bits of data. The controller may be configured to control an operation of the semiconductor memory device. The controller may control the semiconductor memory device so that, in response to sensing of a power-on state of the memory system, an erased block scan operation is performed on the plurality of memory blocks by using a scan read voltage that enables an erase state and a program state of each of the memory cells to be distinguished from each other.

In an embodiment, the controller may control the semiconductor memory device so that the erased block scan operation is performed by transferring a single-level cell (SLC) read command, which is different than a normal read command, to the semiconductor memory device.

In an embodiment, the controller may select a memory block on which the erased block scan operation has not been performed from among the plurality of memory blocks, sequentially generate a plurality of SLC read commands corresponding to a plurality of pages in the selected memory block, and transfer the SLC read commands to the semiconductor memory device.

In an embodiment, the controller may update a block state of the selected memory block based on read data received in response to the plurality of SLC read commands for the selected memory block.

In an embodiment, in response to the SLC read command, the semiconductor memory device may read data from a page corresponding to the SLC read command using the scan read voltage.

An embodiment of the present disclosure may provide for a memory system including a memory device and a controller. The memory device may include a plurality of memory blocks. The controller may be configured to sense a power-on state of the memory system, select a memory block, among the plurality of memory blocks, in response to sensing the power-on state of the memory system, and control the memory device to perform a scan read operation on the selected memory block using a scan read voltage to distinguish an erase state and a program state, and determine whether the selected memory block is an open block, an erased block or a programmed block, based on the scan read operation

BRIEF DESCRIPTION OF THE DRAWINGS

FIG. 16 is a flowchart illustrating an embodiment of operation S200 of FIG. 15.

FIG. 17 is a flowchart illustrating an embodiment of operation S230 of FIG. 16.

DETAILED DESCRIPTION

Specific structural and functional description herein is provided to describe embodiments of the present disclosure. The invention, however, may be practiced in various forms and ways, and thus should not be construed as being limited to the disclosed embodiments.

Figure 1:
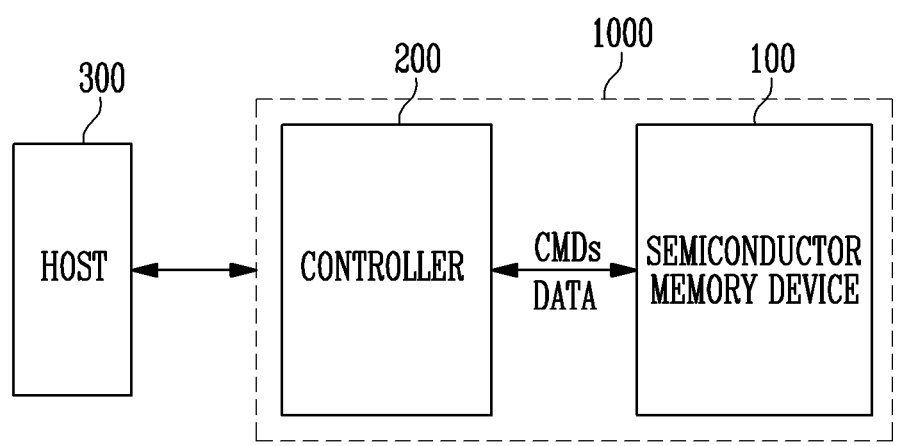
FIG. 1 is a block diagram illustrating a memory system having a controller and a semiconductor memory device.

FIG. 1 is a block diagram illustrating a memory system 1000 having a controller and a semiconductor memory device.

Referring to FIG. 1, the memory system 1000 may include a semiconductor memory device 100 and a controller 200. Further, the memory system 1000 communicates with a host 300. Further, the controller 200 controls overall operation of the semiconductor memory device 100 by transferring commands CMDs in response to requests received from the host 300. Also, the controller 200 transfers pieces of data DATA corresponding to respective commands CMDs to the semiconductor memory device 100 or receives pieces of data DATA from the semiconductor memory device 100. When a program request and program data are received from the host 300, the controller 200 transfers a program command corresponding to the program request and the program data to the semiconductor memory device 100. When a read request is received from the host 300, the controller 200 transfers a read command corresponding to the read request to the semiconductor memory device 100.

Thereafter, the semiconductor memory device 100 transfers read data corresponding to the read command to the controller 200.

When the memory system 1000 switches from a turn-off state to a turn-on state, an operation of booting the memory system 1000 may be performed. The boot operation for the memory system 1000 may include scanning a plurality of memory blocks in the semiconductor memory device 100 to determine current scanned states of the respective memory blocks and storing the scanned states in a memory in the controller 200. For example, the plurality of memory blocks in the semiconductor memory device 100 may be in any one of an erased state, a programmed state, and an open state. When no data is stored in any of physical pages in a certain memory block and all cells in the corresponding memory block are in an erased state, the corresponding memory block is in an erased state. When pieces of data are stored in all physical pages in a certain memory block, the corresponding memory block is in a programmed state. When data is stored in some but not all physical pages in a certain memory block, the corresponding memory block is in an open state. The state of the corresponding memory block may be determined by sequentially reading pieces of data stored in the pages in the memory block. For this, the controller 200 may generate a plurality of read commands for reading data from the pages in the memory block and transfer the read commands to the semiconductor memory device 100. The semiconductor memory device 100 may perform a read operation corresponding to each received read command and transfer read data, as the result of the read operation, to the controller 200.

Figure 2:
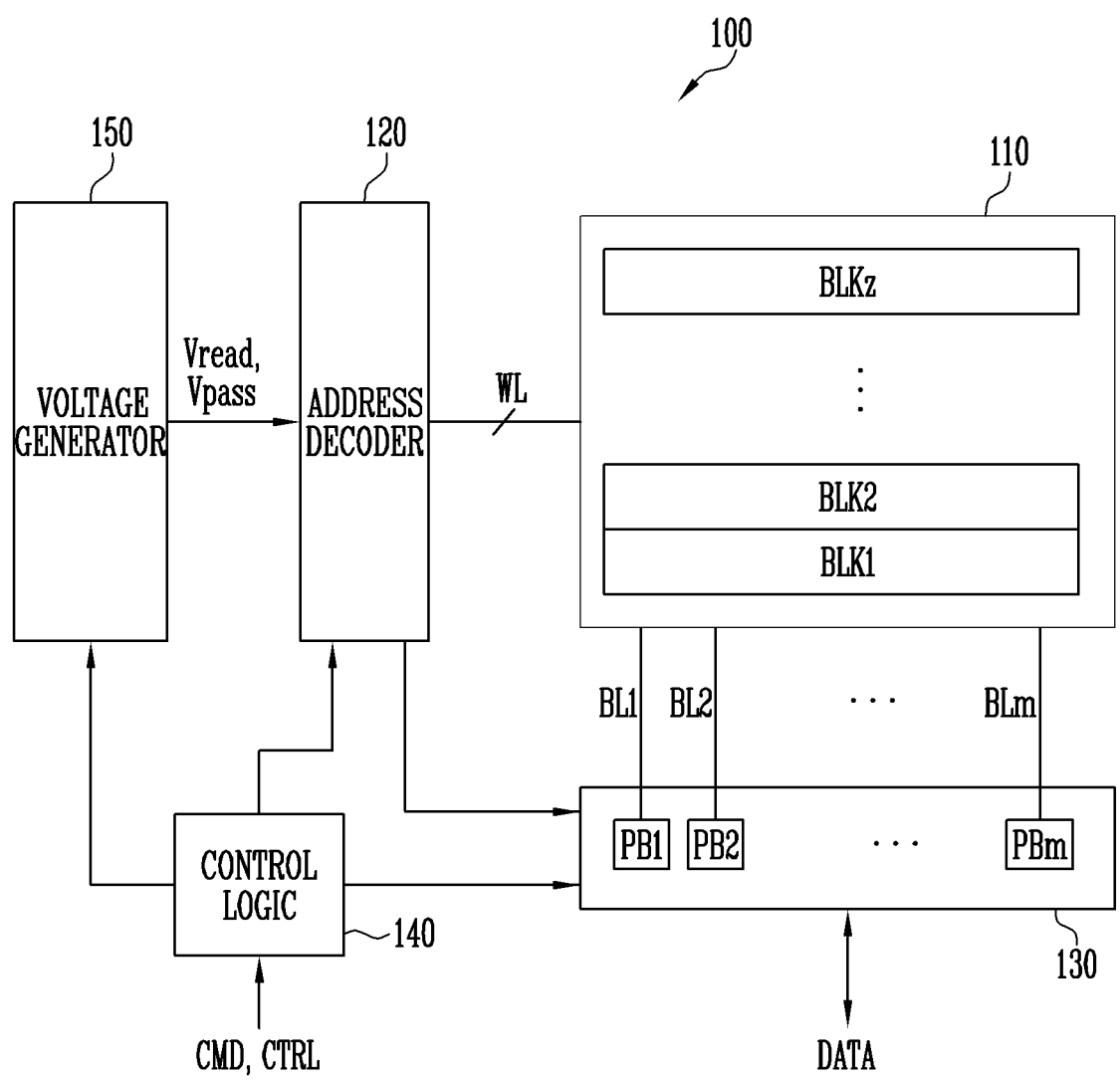
FIG. 2 is a block diagram illustrating an embodiment of the semiconductor memory device of FIG. 1.

FIG. 2 is a block diagram illustrating an embodiment of the semiconductor memory device 100 of FIG. 1.

Referring to FIG. 2, the semiconductor memory device 100 may include a memory cell array 110, an address decoder 120, a read and write circuit 130, control logic 140, and a voltage generator 150.

The memory cell array 110 may include a plurality of memory blocks BLK1 to BLKz. The memory blocks BLK1 to BLKz may be coupled to the address decoder 120 through word lines WL. The memory blocks BLK1 to BLKz may be coupled to the read and write circuit 130 through bit lines BL1 to BLm. Each of the memory blocks BLK1 to BLKz may include a plurality of memory cells. In an embodiment, the plurality of memory cells may be nonvolatile memory cells, and may be implemented as nonvolatile memory cells having a vertical channel structure. In an embodiment, the memory cell array 110 may be implemented as a memory cell array having a two-dimensional (2D) structure. In another embodiment, the memory cell array 110 may be implemented as a memory cell array having a three-dimensional (3D) structure. Each of the memory cells in the memory cell array may store at least one bit of data. In an embodiment, each of the memory cells in the memory cell array 110 may be a single-level cell (SLC), which stores one bit of data. In an embodiment, each of the memory cells in the memory cell array 110 may be a multi-level cell (MLC), which stores two bits of data. In an embodiment, each of the memory cells in the memory cell array 110 may be a triple-level cell (TLC), which stores three bits of data. In an embodiment, each of the memory cells in the memory cell array 110 may be a quad-level cell (QLC), which stores four bits of data. In various embodiments, the memory cell array 110 may include a plurality of memory cells, each of which stores 5 or more bits of data.

The address decoder 120, the read and write circuit 130, and the voltage generator 150 are collectively operated as a peripheral circuit for driving the memory cell array 110. Here, the peripheral circuit is operated under the control of the control logic 140. The address decoder 120 is coupled to the memory cell array 110 through the word lines WL. The address decoder 120 may be operated under the control of the control logic 140. The address decoder 120 may receive addresses through an input/output buffer (not illustrated) provided in the semiconductor memory device 100.

The address decoder 120 may decode a block address, among the received addresses. The address decoder 120 selects at least one memory block based on the decoded block address. When a read voltage application operation is performed during a read operation, the address decoder 120 may apply a read voltage Vread, generated by the voltage generator 150, to a selected word line of a selected memory block, and may apply a pass voltage Vpass to remaining unselected word lines. During a program verify operation, the address decoder 120 may apply a verify voltage, generated by the voltage generator 150, to a selected word line of a selected memory block, and may apply the pass voltage Vpass to remaining unselected word lines.

The address decoder 120 may decode a column address, among the received addresses. The address decoder 120 may transmit the decoded column address to the read and write circuit 130.

The read and program operations of the semiconductor memory device 100 are each performed on a page basis. Addresses received in response to a request for read and program operations may include a block address, a row address, and a column address. The address decoder 120 may select one memory block and one word line in accordance with the block address and the row address. The column address may be decoded by the address decoder 120, and may then be provided to the read and write circuit 130. A plurality of memory cells coupled to one word line may form one physical page. When each of the plurality of memory cells in the semiconductor memory device 100 is a single-level cell (SLC) which stores one bit, one piece of logical page data may be stored in one physical page. When each of the plurality of memory cells in the semiconductor memory device 100 is a multi-level cell (MLC) which stores two bits, two pieces of logical page data, for example, most significant bit (MSB) page data and least significant bit (LSB) page data, may be stored in one physical page. When each of the plurality of memory cells in the semiconductor memory device 100 is a triple-level cell (TLC) which stores three bits, three pieces of logical page data, for example, MSB page data, central significant bit (CSB) page data, and LSB page data, may be stored in one physical page. When each of the plurality of memory cells in the semiconductor memory device 100 is a quad-level cell (QLC) which stores four bits, four pieces of logical page data, for example, MSB page data, high central significant bit (HCSB) page data, low central significant bit (LCSB) page data, and LSB page data, may be stored in one physical page.

The address decoder 120 may include a block decoder, a row decoder, a column decoder, an address buffer, etc.

The read and write circuit 130 includes a plurality of page buffers PB1 to PBm. The read and write circuit 130 may be operated as a "read circuit" during a read operation of the memory cell array 110 and as a "write circuit" during a write operation thereof. The plurality of page buffers PB1 to PBm may be coupled to the memory cell array 110 through the bit lines BL1 to BLm. During a read or program verify operation, in order to sense threshold voltages of the memory cells, the page buffers PB1 to PBm may continuously supply sensing current to the bit lines coupled to the memory cells while each of the page buffers PB1 to PBm senses, through a sensing node, a change in the amount of flowing current depending on the programmed state of a corresponding memory cell and latches it as sensing data. The read and write circuit 130 is operated in response to page buffer control signals output from the control logic 140.

During a read operation, the read and write circuit 130 may sense data stored in the memory cells and temporarily store read data, and may then output data DATA to the input/output buffer (not illustrated) of the semiconductor memory device 100. In an embodiment, the read and write circuit 130 may include a column select circuit or the like as well as the page buffers (or page registers).

The control logic 140 is coupled to the address decoder 120, the read and write circuit 130, and the voltage generator 150. The control logic 140 may receive a command CMD and a control signal CTRL through the input/output buffer (not illustrated) of the semiconductor memory device 100. The control logic 140 may control overall operation of the semiconductor memory device 100 in response to the control signal CTRL. Also, the control logic 140 may output a control signal for controlling the precharge potential level of the sensing node of the plurality of page buffers PB1 to PBm. The control logic 140 may control the read and write circuit 130 to perform a read operation of the memory cell array 110. The control logic 140 may control the voltage generator 150 so that various voltages to be used for the program operation of the memory cell array 110 are generated. Also, the control logic 140 may control the address decoder 120 so that the voltages generated by the voltage generator 150 are transferred to local lines of a memory block that is the target of operation through global lines. The control logic 140 may control the read and write circuit 130 so that, during a read operation, the read and write circuit 130 reads data from a selected page of the memory block through the bit lines BL1 to BLm and stores the read data in the page buffers PB1 to PBm. Furthermore, the control logic 140 may control the read and write circuit 130 so that, during a program operation, the read and write circuit 130 programs the data, stored in the page buffers PB1 to PBm, to a selected page.

The voltage generator 150 may generate a read voltage Vread and a pass voltage Vpass used for a read operation in response to the control signal output from the control logic 140. The voltage generator 150 may include a plurality of pumping capacitors for receiving an internal supply voltage to generate a plurality of voltages having various voltage levels, and may generate a plurality of voltages by selectively enabling the plurality of pumping capacitors under the control of the control logic 140.

The address decoder 120, the read and write circuit 130, and the voltage generator 150 (collectively, the peripheral circuit) may perform a read operation, a write operation, and an erase operation on the memory cell array 110. The peripheral circuit may perform a read operation, a write operation, and an erase operation on the memory cell array 110 under the control of the control logic 140.

Figure 3:
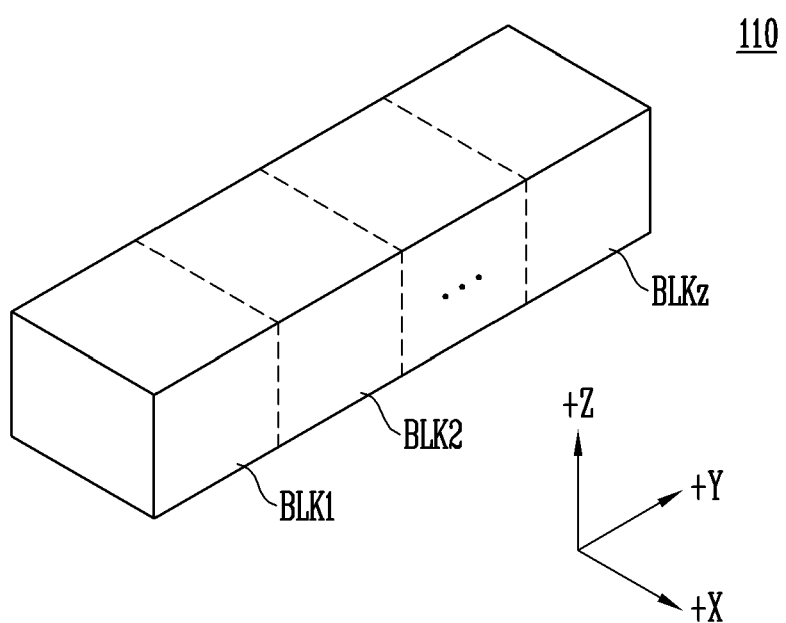
FIG. 3 is a block diagram illustrating an embodiment of a memory cell array of FIG. 2.

FIG. 3 is a block diagram illustrating an embodiment of the memory cell array 110 of FIG. 2.

Referring to FIG. 3, the memory cell array 110 may include a plurality of memory blocks BLK1 to BLKz. Each memory block may have a three-dimensional (3D) structure. Each memory block includes a plurality of memory cells stacked on a substrate. Such memory cells are arranged along a positive X (+X) direction, a positive Y (+Y) direction, and a positive Z (+Z) direction. The structure of each memory block is described in detail below with reference to FIGS. 4 and 5.

Figure 4:
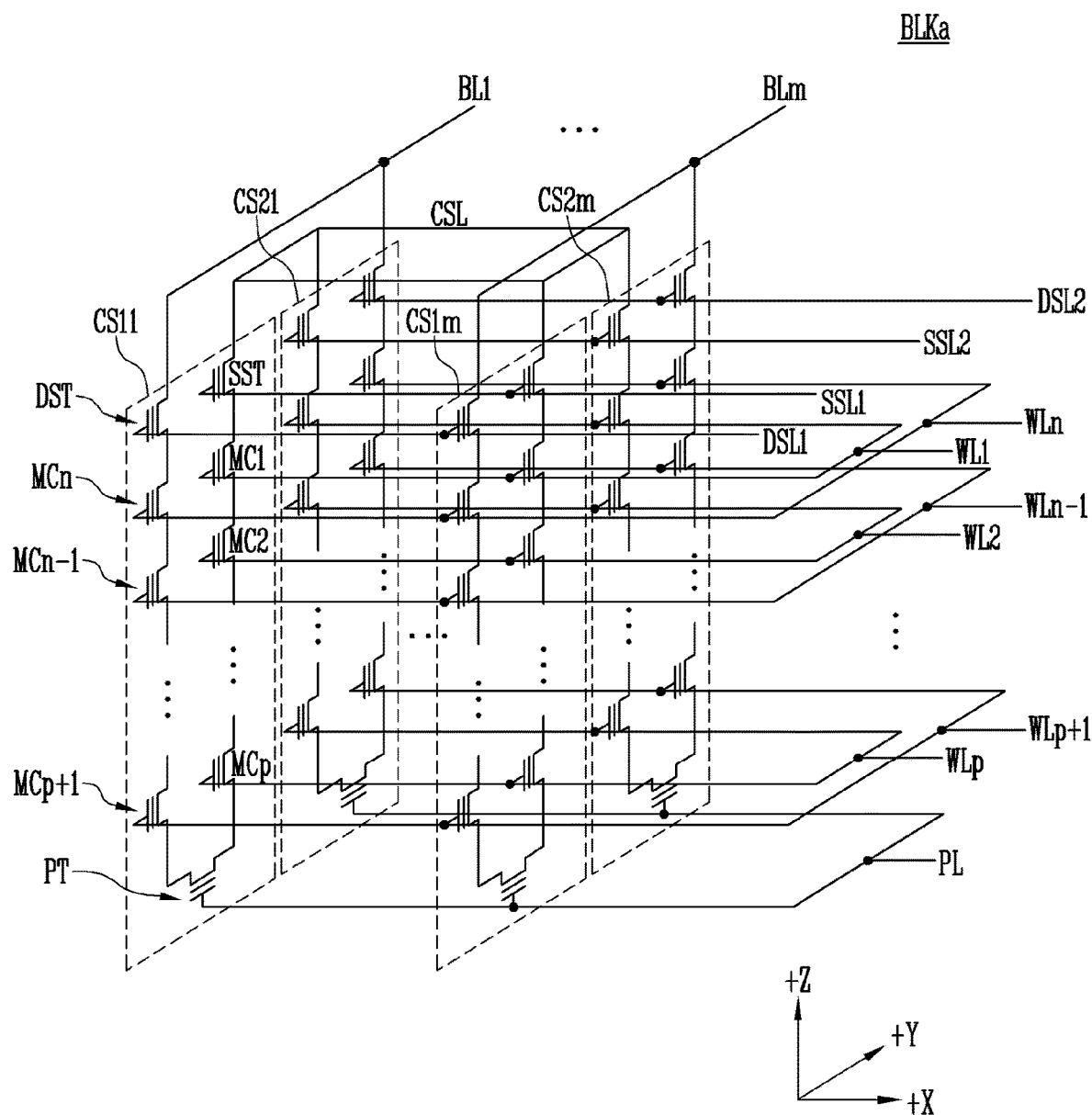
FIG. 4 is a circuit diagram illustrating any one memory block BLKa of memory blocks BLK1 to BLKz of FIG. 3.

FIG. 4 is a circuit diagram illustrating any one memory block BLKa of the memory blocks BLK1 to BLKz of FIG. 3.

Referring to FIG. 4, the memory block BLKa includes a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings are arranged in a row direction (i.e., positive (+) X direction). In FIG. 4, two cell strings are illustrated as being arranged in a column direction (i.e., positive (+) Y direction). However, this illustration is made for clarity; three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 4, source select transistors of cell strings CS11 to CS1$m$ in a first row are coupled to a first source select line SSL1. The source select transistors of cell strings CS21 to CS2$m$ in a second row are coupled to a second source select line SSL2.

In an embodiment, source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a negative (−) Z direction and are connected in series between the source select transistor SST and the pipe transistor PT. The (p+1)-th to n-th memory cells MCp+1 to MCn are sequentially arranged in the +Z direction and are connected in series between the pipe transistor PT and the drain select transistor DST. The first to p-th memory cells MC1 to MCp and the (p+1)-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extended in a column direction. In FIG. 4, cell strings CS11 and CS21 in a first column are coupled to a first bit line BL1. Cell strings CS1m and CS2m in an m-th column are coupled to an m-th bit line BLm.

The memory cells coupled to the same word line in cell strings arranged in a row direction constitute a single page. For example, memory cells coupled to the first word line WL1, among the cell strings CS11 to CS1m in the first row, constitute a single page. Memory cells coupled to the first word line WL1, among the cell strings CS21 to CS2m in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1m or CS21 to CS2m arranged in a row direction, may be coupled to the even bit lines, respectively, and odd-numbered cell strings, among the cell strings CS11 to CS1m or CS21 to CS2m arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 5:
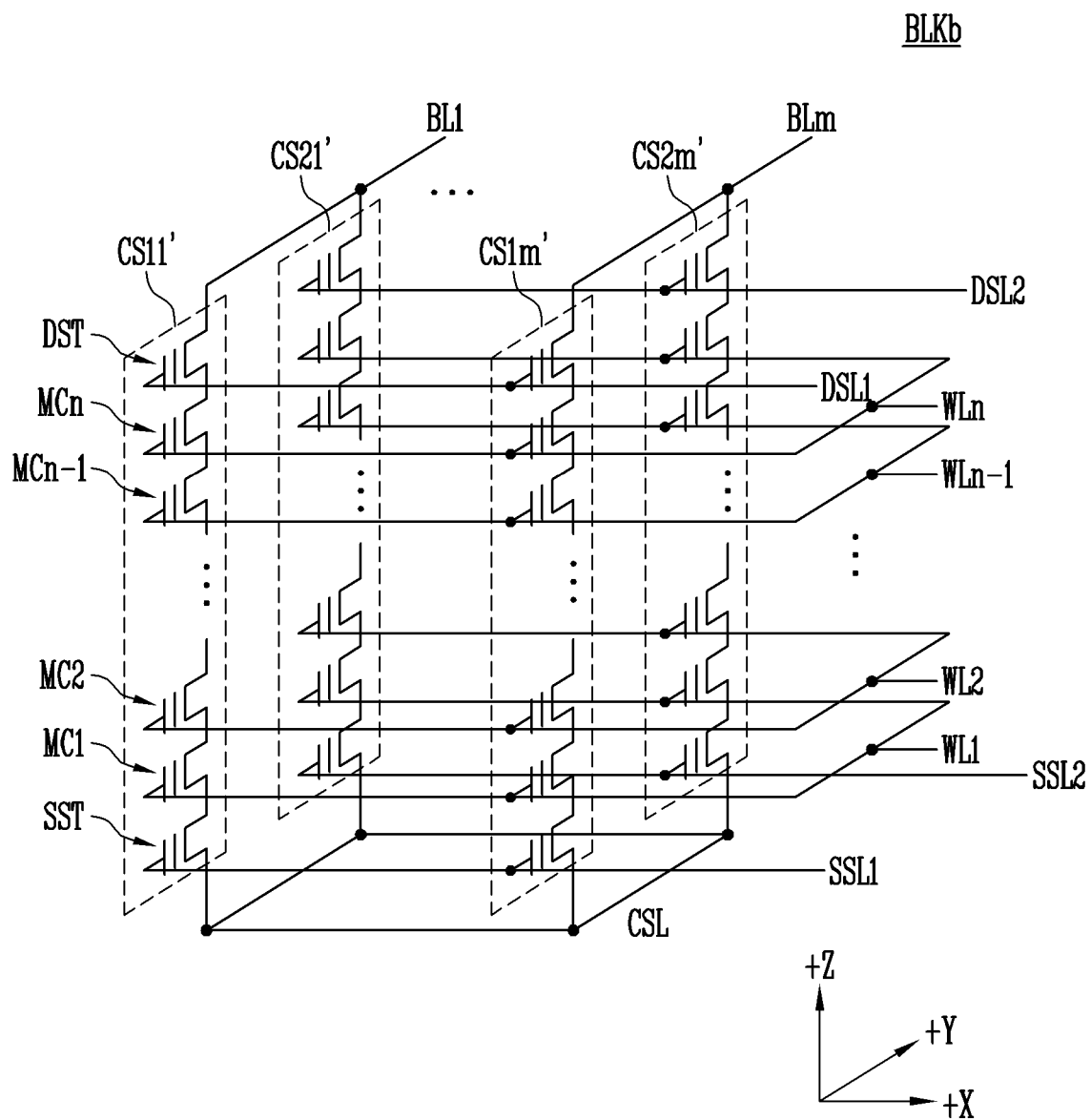
FIG. 5 is a circuit diagram illustrating an example of any one memory block BLKb of the memory blocks BLK1 to BLKz of FIG. 3.

FIG. 5 is a circuit diagram illustrating an example of any one memory block BLKb of the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' is extended along a positive Z (+Z) direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 5 has an equivalent circuit similar to that of the memory block BLKa of FIG. 4 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer memory cells are provided, the size of the memory block BLKb is reduced, but the reliability of the operation of the memory block BLKb may be deteriorated.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 6:
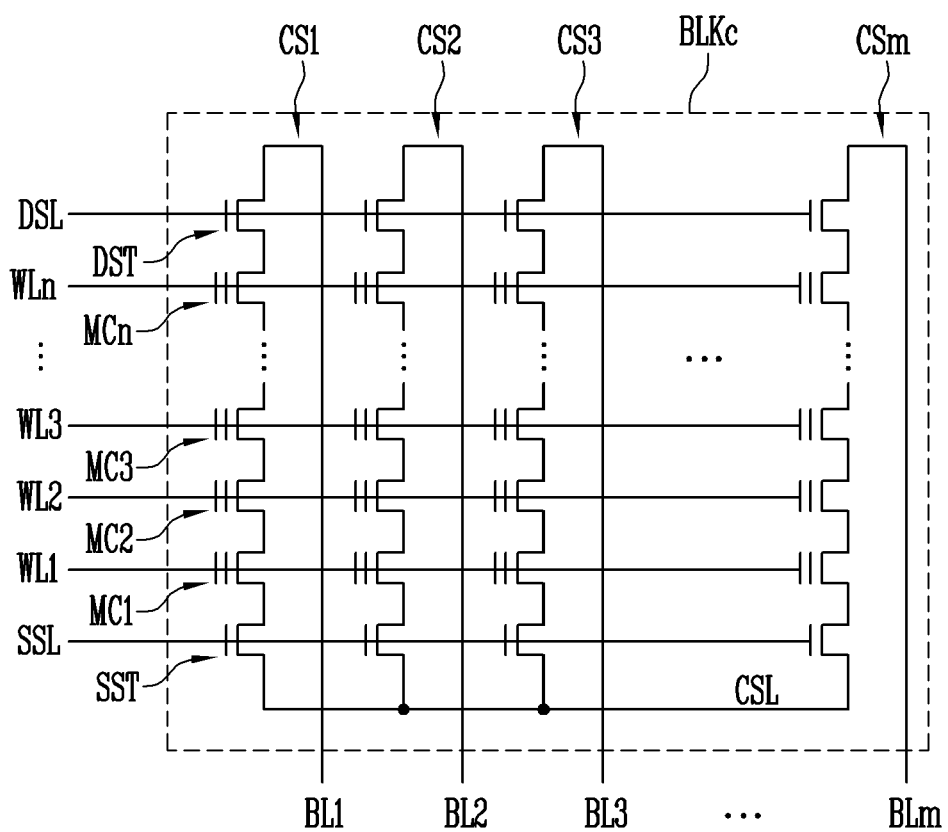
FIG. 6 is a circuit diagram illustrating an example of any one memory block BLKc of the memory blocks BLK1 to BLKz in the memory cell array of FIG. 2.

FIG. 6 is a circuit diagram illustrating an example of any one memory block BLKc of the memory blocks BLK1 to BLKz in the memory cell array 110 of FIG. 2.

Referring to FIG. 6, the memory block BLKc includes a plurality of cell strings CS1 to CSm. The plurality of cell strings CS1 to CSm may be coupled to a plurality of bit lines BL1 to BLm, respectively. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

The memory cells coupled to the same word line may constitute a single page. The cell strings CS1 to CSm may be selected by selecting the drain select line DSL. One page may be selected from the selected cell strings by selecting any one of the word lines WL1 to WLn.

In other embodiments, even bit lines and odd bit lines may be provided instead of the first to m-th bit lines BL1 to BLm. Among the cell strings CS1 to CSm, even-numbered cell strings may be coupled to the even bit lines, respectively, and odd-numbered cell strings may be coupled to the odd bit lines, respectively.

As illustrated in FIGS. 3 to 5, the memory cell array 110 of the semiconductor memory device 100 may be implemented as a memory cell array having a 3D structure. Further, as illustrated in FIG. 6, the memory cell array 110 of the semiconductor memory device 100 may be implemented as a memory cell array having a 2D structure.

Figure 7:
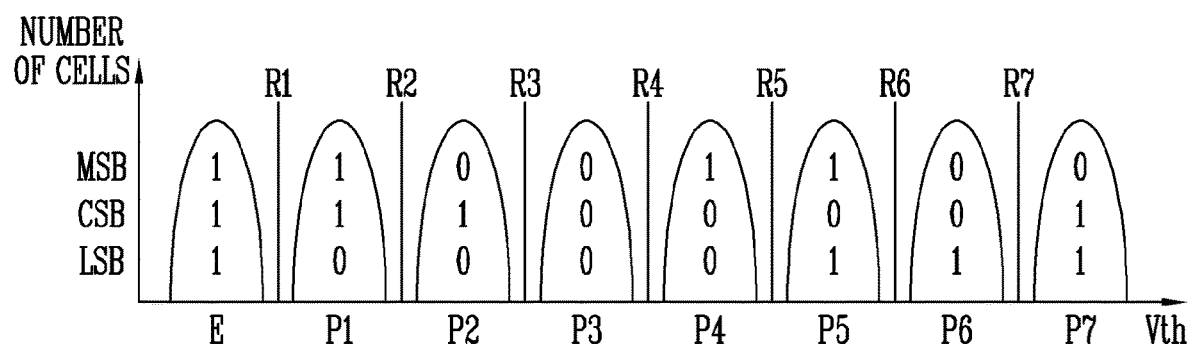
FIG. 7 is a graph illustrating threshold voltage distributions of triple-level cells (TLC).

FIG. 7 is a graph illustrating threshold voltage distributions of triple-level cells (TLC). Referring to FIG. 7, the threshold voltage distributions of TLCs and read levels R1 to R7 for reading the threshold voltage distributions are illustrated. In FIG. 7, pieces of bit data corresponding to an erase state E and first to seventh program states P1 to P7, respectively, are depicted. The specific logic code shown is exemplary; the specific set of bits that designate each of the states may be different than that shown in FIG. 7.

Referring to FIG. 7, memory cells which store bits of "1 1 1" in the order of MSB-CSB-LSB are maintained in the erase state E. Memory cells which store bits of "1 1 0" are programmed to the first program state P1. In this way, memory cells which store bits of "0 1 0", "0 0 0", "1 0 0", "1 0 1", "0 0 1", and "0 1 1" are programmed to any one of the second to seventh program states P2 to P7. In order to distinguish threshold voltage states of respective memory cells from each other, the first to seventh read levels R1 to R7 may be used.

Referring to FIG. 7, in order to read data from an MSB page, the threshold voltages of memory cells should be sensed at the second read level R2, the fourth read level R4, and the sixth read level R6. In order to read data from a CSB page, the threshold voltages of memory cells should be sensed at the third read level R3 and the seventh read level R7. In order to read data from an LSB page, the threshold voltages of memory cells should be sensed at the first read level R1 and the fifth read level R5.

In order to determine whether all memory cells in a selected physical page are in an erase state E, an LSB read operation may be performed as an example. For example, when all bits in read LSB page data are '1' as a result of performing the LSB read operation using the first read level R1 and the fifth read level R5, the corresponding physical page may be determined to be an erased page, i.e., a page in an erase state E. When a bit of '0' and a bit of '1' coexist in read LSB page data as a result of performing the LSB read operation using the first read level R1 and the fifth read level R5, the corresponding physical page may be determined to be a programmed page, i.e., a page in a program state.

Figure 8:
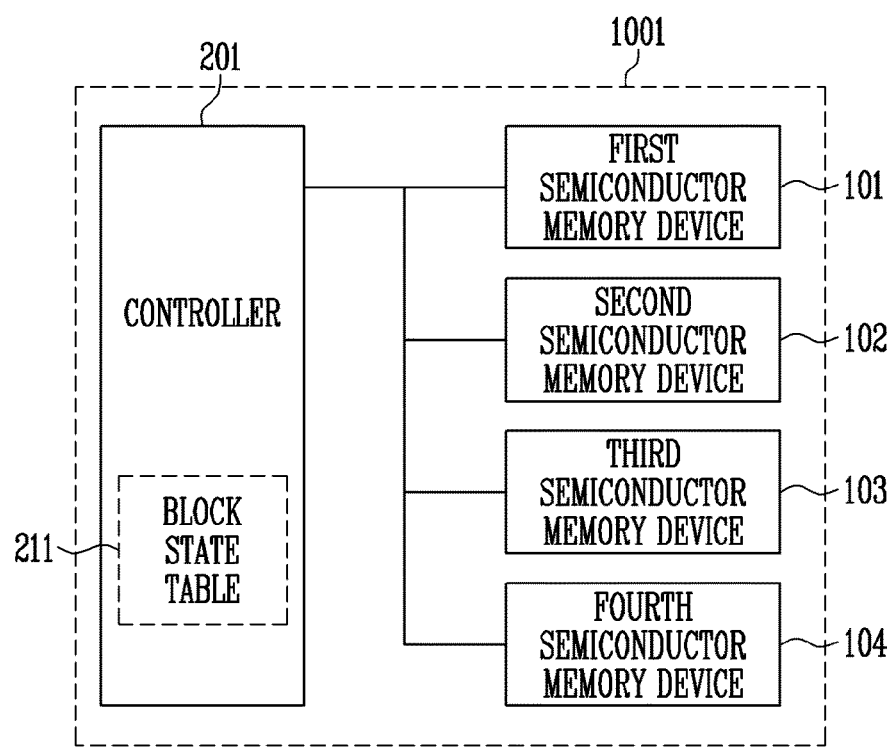
FIG. 8 is a block diagram illustrating a memory system according to an embodiment of the present disclosure.

FIG. 8 is a block diagram illustrating a memory system 1001 according to an embodiment of the present disclosure. Referring to FIG. 8, the memory system 1001 may include first to fourth semiconductor memory devices 101 to 104 and a controller 201. Each of the first to fourth semiconductor memory devices 101 to 104 may be configured in a manner similar to that of the semiconductor memory device 100 in FIG. 2. The first to fourth semiconductor memory devices 101 to 104 may be coupled to the controller 201 through one or more channels. Although, in FIG. 8, the first to fourth semiconductor memory devices 101 to 104 are illustrated as being coupled to the controller 201 through one channel, the first to fourth semiconductor memory devices 101 to 104 may alternatively be coupled to the controller 201 through 2 to 4 channels. In some embodiments, the controller 201 may include a block state table 211. The block state table 211 may indicate the states of a plurality of memory blocks in each of the first to fourth semiconductor memory devices 101 to 104. The block state table 211 may be stored in a volatile memory in the controller 201, for example, a static random access memory (SRAM) or a dynamic random access memory (DRAM). When the memory system 1001 boots, the controller 201 may scan the current the plurality of memory blocks in the first to fourth semiconductor memory devices 101 to 104 to determine the states of the respective memory blocks, may configure the block state table 211 from the scanned states, and may then store the block state table 211 in the memory in the controller 201, for example, the SRAM or DRAM.

Figure 9A:
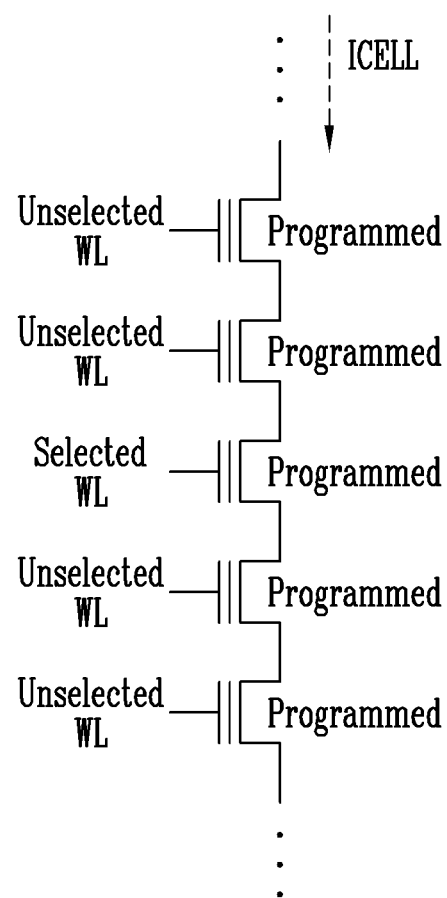
FIGS. 9A and 9B illustrate a cell string including memory cells in a program state and a cell string including memory cells in an erase state.
Figure 9B:
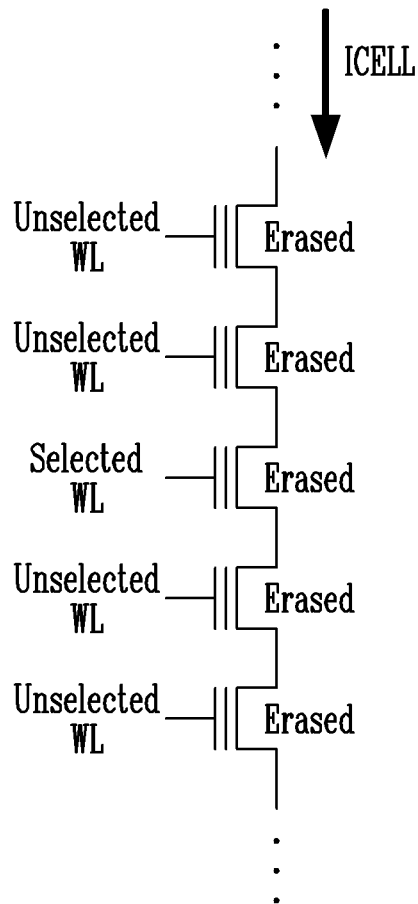
Figure 10:
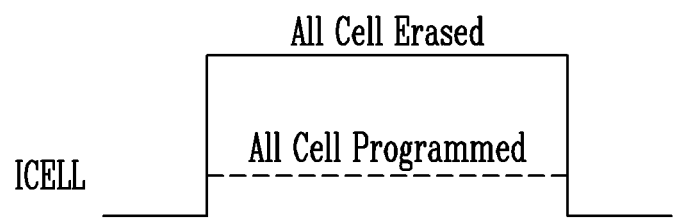
FIG. 10 is a diagram for explaining cell currents flowing through a cell string including memory cells in a program state and a cell string including memory cells in an erase state.

FIGS. 9A and 9B illustrate a cell string including memory cells in a program state and a cell string including memory cells in an erase state. FIG. 10 is a diagram for explaining cell currents flowing through a cell string including memory cells in a program state and a cell string including memory cells in an erase state. Referring to FIG. 9A, a cell string in a programmed memory block is illustrated. The cell string in the programmed memory block includes a plurality of programmed memory cells. When a read voltage is applied to a selected word line and a read pass voltage is applied to unselected word lines, a cell current ICELL flowing through the programmed memory cells may have a relatively low value. Referring to FIG. 9B, a cell string in an erased memory block is illustrated. The cell string in the erased memory block is in a state in which all memory cells have been erased. When a read voltage is applied to a selected word line and a read pass voltage is applied to unselected word lines, a cell current ICELL flowing through the cell string including memory cells in an erase state may have a relatively high value because the threshold voltages of the memory cells in the erase state have relatively low values and the read pass voltage or the read voltage has a relatively high value.

Therefore, as illustrated in FIG. 10, a cell current ICELL caused by a read operation performed on a cell string in which all cells are erased is greater than that caused by a read operation performed on a cell string in which all cells are programmed. That is, current consumption, occurring when a read operation is performed on a memory block in an erase state during the operation of booting the memory system 1001, is greater than that occurring when a read operation is performed on a memory block in a program state. As illustrated in FIG. 8, when the memory system 1001 includes the plurality of memory blocks 101 to 104 and an erased block scan operation is simultaneously performed on the plurality of memory blocks in the plurality of memory blocks 101 to 104, a high peak current may occur.

Figure 11:
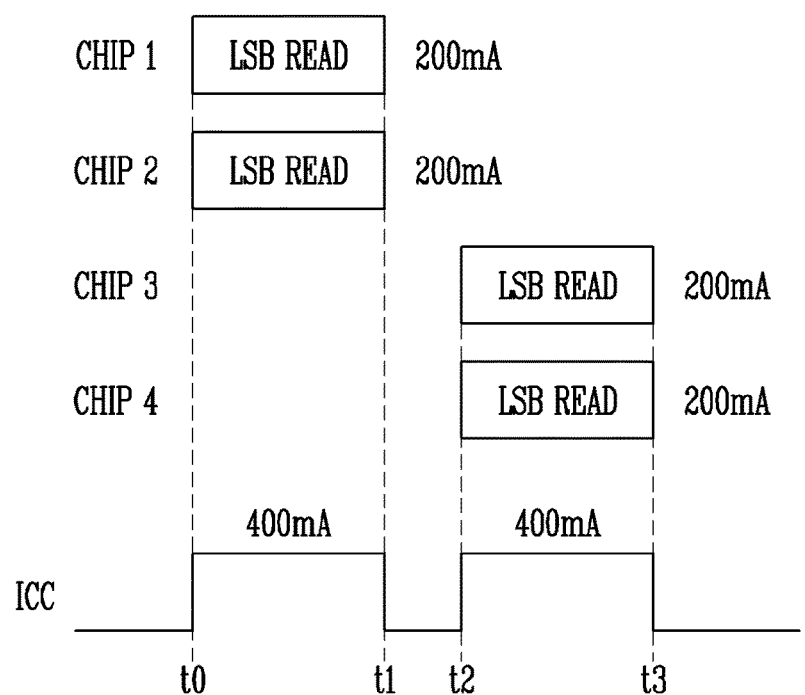
FIG. 11 is a timing diagram illustrating an erased block scan operation using an LSB read operation.

FIG. 11 is a timing diagram illustrating an erased block scan operation using an LSB read operation. In FIG. 11, a first chip CHIP1 to a fourth chip CHIP4 may respectively correspond to the first to fourth semiconductor memory devices 101 to 104 of FIG. 8.

Referring to FIG. 11, during an erased block scan operation, an LSB read operation (i.e., a read operation on a least significant bit (LSB) page) may be performed. As described above with reference to FIG. 7, the LSB read operation may use a first read level R1 and a fifth read level R5. When the erased block scan operation is performed using the LSB read operation, maximum current consumed by each chip may be, for example, 200 mA. When the maximum current that is permitted in the design of the memory system 1001 is 400 mA, the erased block scan operation cannot be simultaneously performed on the first to fourth chips CHIP1 to CHIP4. In an example, as illustrated in FIG. 11, the erased block scan operation may be performed on the first and second chips CHIP1 and CHIP2 during a period from t0 to t1, and may be performed on the third and fourth chips CHIP3 and CHIP4 during a period from t2 to t3. By means of this operation, internally consumed current ICC of the memory system 1001 may be limited to a maximum of 400 mA.

As illustrated in FIG. 11, when the LSB read operation is used in the erased block scan operation, the maximum current used for the erased block scan operation on each chip has a relatively high value. Therefore, in order to satisfy the permissible maximum current limit of the memory system 1001, the erased block scan operation may be performed on a plurality of chips in two intervals or time periods. In this case, the time it takes to perform the erased block scan operation increases, which becomes a factor that contributes to deterioration of the operating performance of the memory system 1001.

In accordance with an embodiment of the present disclosure, the read operation in the erased block scan operation may be configured differently from a normal read operation. In greater detail, during the erased block scan operation, an SLC read operation is used. The SLC read operation for the erased block scan operation uses a read level. The read level, which is used in the SLC read operation for the erased block scan operation, is relatively lower than a read level used in a SLC read operation for a normal read operation. Therefore, current used in the read operation performed on the erased block may be reduced, and thus the maximum current consumed by the erased block scan operation of each semiconductor memory device may be decreased. Accordingly, the number of semiconductor memory devices which can simultaneously perform an erased block scan operation may increase, in which case the time it takes to perform the erased block scan operation may be reduced. Accordingly, the operating performance of the memory system 1001 may be improved.

Figure 12:
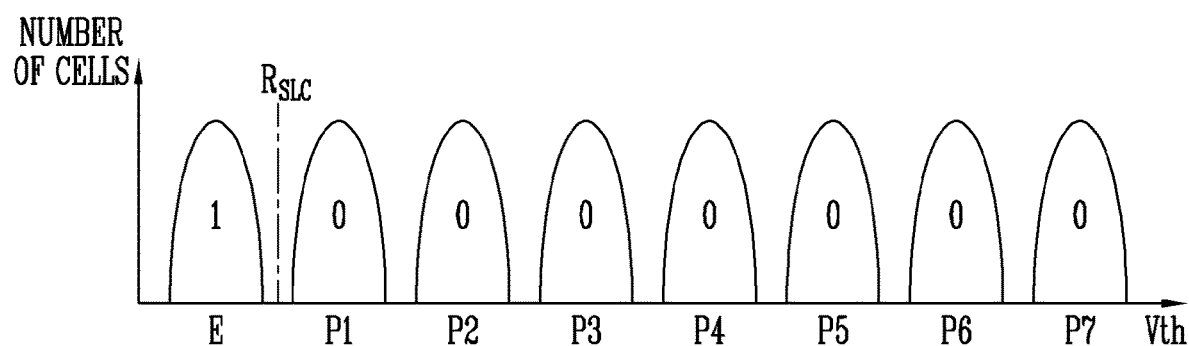
FIG. 12 is a diagram for explaining an SLC read operation used in an erased block scan operation according to an embodiment of the present disclosure.
Figure 13:
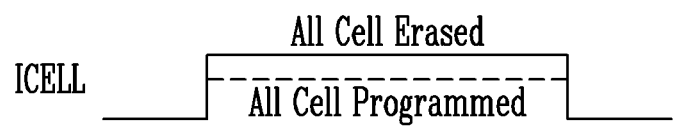
FIG. 13 is diagram for explaining a cell current flowing through a cell string when an SLC read operation is performed according to an embodiment of the present disclosure.

FIG. 12 is a diagram for explaining an SLC read operation used in an erased block scan operation according to an embodiment of the present disclosure. FIG. 13 is diagram for explaining a cell current flowing through a cell string when an SLC read operation is performed according to an embodiment of the present disclosure. Referring to FIG. 12, similar to FIG. 7, a graph illustrating threshold voltage distributions of triple-level cells (TLC) is illustrated. In accordance with an embodiment of the present disclosure, an SLC read operation may be used even in an erased block scan operation of a semiconductor memory device including triple-level cells. For this operation, a read operation is performed on a selected memory block using an SLC read level $R_{SLC}$ for distinguishing memory cells in an erase state E from memory cells in first to seventh program states P1 to P7. As illustrated in FIG. 12, the SLC read level $R_{SLC}$ is a relatively small value, and thus a cell current ICELL flowing through a cell string including memory cells in an erase state may be relatively low. Therefore, as illustrated in FIG. 13, the difference between a cell current ICELL caused by a read operation performed on a cell string in which all cells are programmed and a cell current ICELL caused by a read operation performed on a cell string in which all cells are erased is not large. That is, current consumed when a read operation is performed on a memory block in an erase state during an operation of booting the memory system 1001 may be reduced relative to the cell current in the read operation on programmed cells.

Although the SLC read operation performed on the memory block including triple-level cells (TLC) has been described with reference to FIG. 12, the present disclosure is not limited thereto. For example, an erased block scan operation may be performed even on a memory block including multi-level cells (MLC), quad-level cells (QLC) or memory cells for storing five or more bits of data, based on an SLC read operation.

Figure 14:
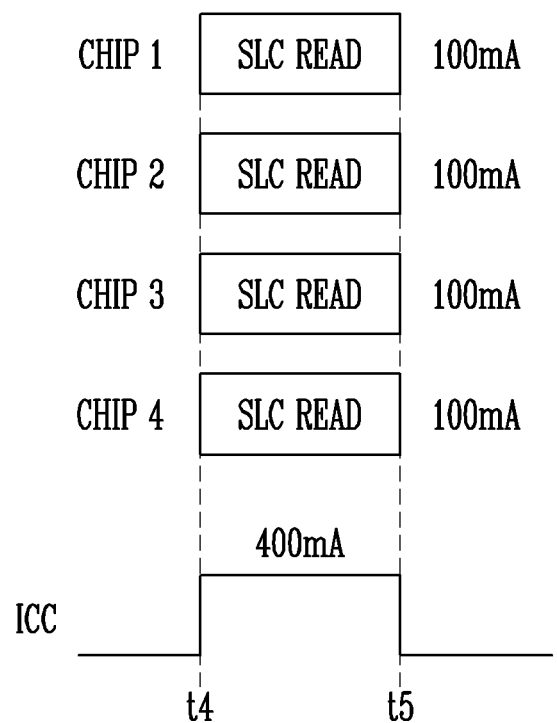
FIG. 14 is a timing diagram illustrating an erased block scan operation using an SLC read operation according to an embodiment of the present disclosure.

FIG. 14 is a timing diagram illustrating an erased block scan operation using an SLC read operation according to an embodiment of the present disclosure. In FIG. 14, a first chip CHIP1 to a fourth chip CHIP4 may respectively correspond to the first to fourth semiconductor memory devices 101 to 104 of FIG. 8.

Referring to FIG. 14, an SLC read operation may be used in an erased block scan operation according to an embodiment of the present disclosure. As described above with reference to FIG. 12, the SLC read operation may use an SLC read level $R_{SLC}$. When the erased block scan operation is performed using the SLC read operation, current consumed by an erased block may be decreased. Therefore, the maximum current consumed by each chip during the SLC read operation may be, for example, 100 mA. When the maximum current that is permitted in the design of the memory system 1001 is 400 mA, the erased block scan operation may be simultaneously performed on the first to fourth chips CHIP1 to CHIP4. In an example, as illustrated in FIG. 14, during a period from t4 to t5, the erased block scan operation may be performed on the first to fourth chips CHIP1 to CHIP4. By means of this operation, the period from t4 to t5 to perform the erased block scan operation during a boot operation may be minimized while the internally consumed current ICC of the memory system 1001 is limited to a maximum of 400 mA or less. Consequently, the time it takes to perform the erased block scan operation may be reduced, and thus the operating performance of the memory system 1001 may be improved.

Figure 15:
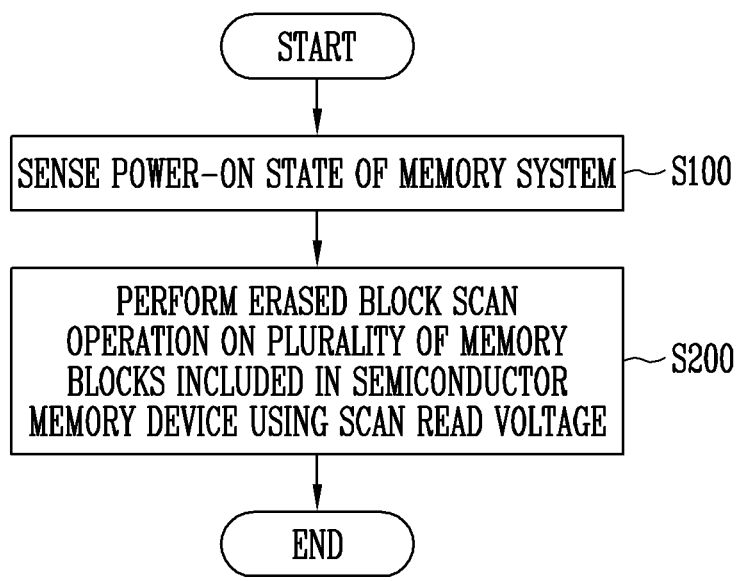
FIG. 15 is a flowchart illustrating a method of operating a controller according to an embodiment of the present disclosure.

FIG. 15 is a flowchart illustrating a method of operating a controller according to an embodiment of the present disclosure. Referring to FIG. 15, the controller may perform operation S100 of sensing a power-on state of the memory system 1001. Further, the controller may perform operation S200 of performing an erased block scan operation on a plurality of memory blocks in a semiconductor memory device using a scan read voltage. When the memory system switches from a turn-off state to a turn-on state, the controller may sense that the memory system has been powered on. In response to the sensing, the controller may start an operation of booting the memory system.

During the operation of booting the memory system, the controller may perform an erased block scan operation on the plurality of memory blocks in the semiconductor memory device using the scan read voltage at operation S200. The scan read voltage may be substantially identical to the SLC read level $R_{SLC}$ illustrated in FIG. 12. In an example, the scan read voltage may be a read level for distinguishing the erase state E of the memory cells from the remaining states, that is, program states P1 to P7. A detailed embodiment of operation S200 is described below with reference to FIG. 16.

FIG. 16 is a flowchart illustrating an embodiment of operation S200 of FIG. 15.

Referring to FIG. 16, operation S200 of FIG. 15 may include operations S210 to S270. Operation S210 may include selecting a memory block, on which a read operation is to be performed based on an SLC read scheme, from among a plurality of memory blocks on which a scan operation has not been performed. Operation S230 may include controlling the semiconductor memory device so that an SLC read operation is performed on the selected memory block using a scan read voltage. Operation S250 may include updating the block state of the selected memory block based on the results of the SLC read operation. Operation S270 may include determining whether erased block scanning on all blocks has been completed.

At operation S210, a memory block on which the erased block scan operation is not yet performed is selected from among the plurality of memory blocks in the semiconductor memory device. At operation S230, the SLC read operation is performed on the selected memory block using the SLC read level $R_{SLC}$ illustrated in FIG. 12. Further, at step S230, the block state of the selected memory block may be determined. At operation S250, the block state of the selected memory block is updated based on the results of the SLC read operation. In detail, at operation S250, the block state table 211 in FIG. 8 may be updated. When it is determined at operation S270 that the erased block scan operation on all memory blocks has been completed (S270, YES), operation S200 is terminated. When it is determined at operation S270 that the erased block scan operation on all memory blocks is not yet completed (S270, NO), the process returns to operation S210 of selecting a memory block, on which the erased block scan operation has not yet been performed, from among the plurality of memory blocks in the semiconductor memory device, after which operations S230 to S250 are repeated.

Figure 18A:
FIGS. 18A to 18C are diagrams illustrating memory blocks in an erase state, a program state, and an open state.
Figure 18B:
Figure 18C:

FIG. 17 is a flowchart illustrating an embodiment of operation S230 of FIG. 16. FIGS. 18A to 18C are diagrams illustrating memory blocks in an erase state, a program state, and an open state. Below, an embodiment of operation S230 of FIG. 16 is described with reference to FIGS. 17 and 18A to 18C.

Referring to FIG. 17, pieces of data stored in pages in the selected memory block are sequentially read at operation S231. Since the memory block includes a plurality of physical pages, the current state of the memory block may be determined by verifying whether data is stored in the plurality of physical pages.

Referring to FIGS. 18A to 18C, a memory block including 16 physical pages Page1 to Page16 is illustrated by way of example. In FIGS. 18A to 18C, a page in an erase state in which data is not stored is indicated by a white area, and a page in a program state in which data is stored is indicated by a hatched area.

Referring to FIG. 18A, all physical pages in the memory block are erased pages, in which data is not stored. This indicates that all memory cells in the memory block are in the erase state E, such as that in FIG. 12. Thus, the memory block shown in FIG. 18A is in an erase state.

Referring to FIG. 18B, all physical pages in a memory block are programmed pages, in which data is stored. This means that all memory cells in the memory block are evenly distributed in the erase state E and the first to seventh programmed states P1 to P7 of FIG. 12. Thus, the memory block shown in FIG. 18B is in a program state.

Referring to FIG. 18C, it can be seen that, among all physical pages in a memory block, first to ninth pages Page1 to Page9 are programmed pages in which data is stored, and tenth to sixteenth pages Page10 to Page16 are erased pages in which data is not stored. This means that the corresponding memory block is an open block, which indicates that at least one of the pages is an erased page which can store data.

Referring back to FIG. 17, at operation S231, a read operation is performed on physical pages in the memory block using a scan read voltage. When data is stored in a physical page, bits of 0 and bits of 1 may coexist in read data as a result of the read operation using the scan read voltage. In this case, the corresponding physical page is determined to be a programmed page. When data is not stored in a physical page, only bits of '1' may be included in the read data as a result of the read operation using the scan read voltage. In this case, the corresponding physical page is determined to be an erased page.

At operation S233, the read data is analyzed and the corresponding operation is performed based on the result of the analysis. When it is determined that all of a plurality of pages in the corresponding memory block are erased pages, the selected memory block is determined to be an erased block at operation S237. When it is determined that all of a plurality of pages in the corresponding memory block are programmed pages, the selected memory block is determined to be a programmed block at operation S239. When it is determined that the plurality of pages in the corresponding memory block include both an erased page and a programmed page, the selected memory block is determined to be an open block at operation S235.

Figure 19:
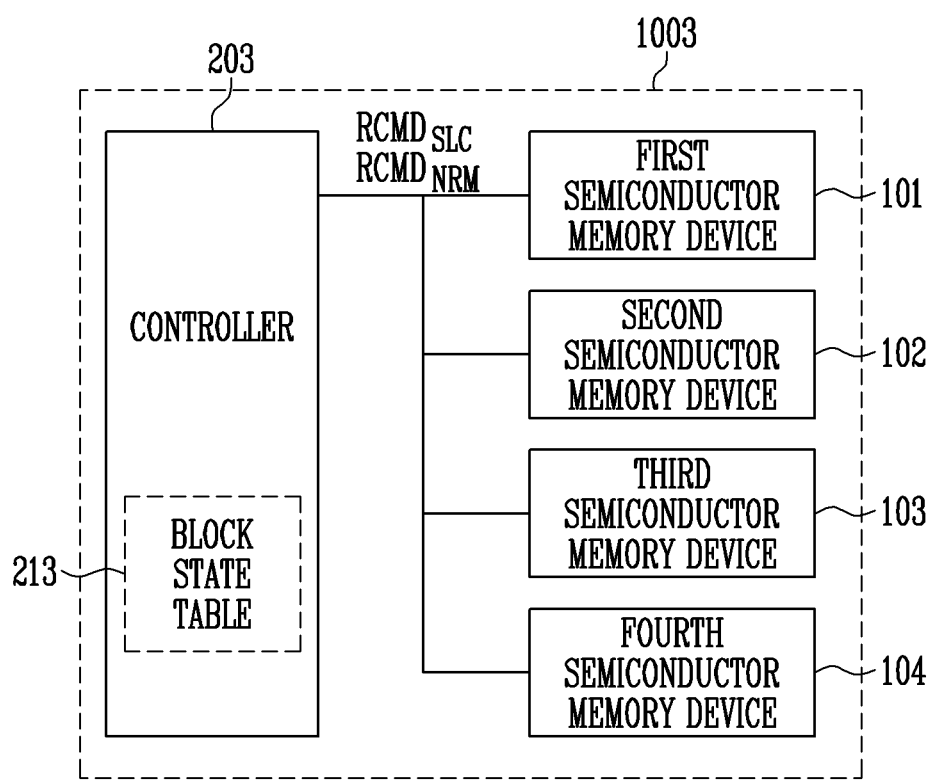
FIG. 19 is a block diagram illustrating a memory system according to an embodiment of the present disclosure.

FIG. 19 is a block diagram illustrating a memory system 1003 according to an embodiment of the present disclosure. The memory system 1003 may include a controller 203 and first to fourth semiconductor memory devices 101 to 104. The controller 203 may store a block state table 213. During an erased block scan operation of the memory system 1003, the controller 203 may generate an SLC read command $RCMD_{SLC}$ and then transfer the generated command to the first to fourth semiconductor memory devices 101 to 104. During a normal read operation of the memory system 1003, the controller 203 may generate a normal read command $RCMD_{NRM}$ and then transfer the generated command to a semiconductor memory device selected from among the first to fourth semiconductor memory devices 101 to 104. Each of the first to fourth semiconductor memory devices 101 to 104 may perform a read operation depending on the type of a read command that has been received. For example, when any one of the first to fourth semiconductor memory devices 101 to 104 receives the SLC read command $RCMD_{SLC}$, the semiconductor memory device having received the SLC read command $RCMD_{SLC}$ may perform a read operation on the selected physical page using a scan read voltage. In an example, when any one of the first to fourth semiconductor memory devices 101 to 104 receives a normal read command $RCMD_{NRM}$, for example, an LSB read command, the semiconductor memory device having received the LSB read command may perform a read operation on the selected physical page using first and fifth read levels R1 and R5 illustrated in FIG. 7. Hereinafter a method of operating a semiconductor memory device according to an embodiment of the present disclosure is described with reference to FIG. 20.

Figure 20:
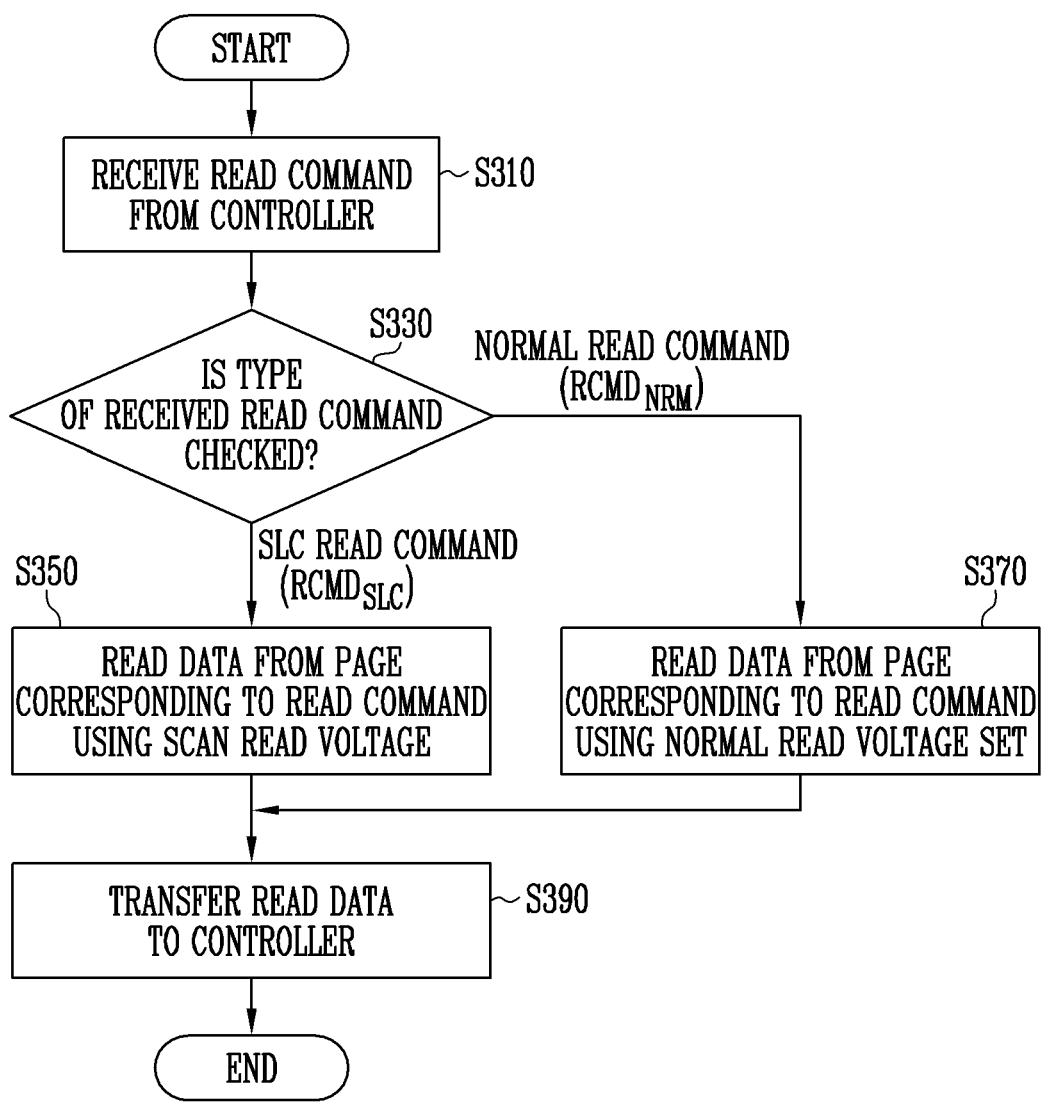
FIG. 20 is a flowchart illustrating a method of operating a semiconductor memory device according to an embodiment of the present disclosure.

FIG. 20 is a flowchart illustrating a method of operating a semiconductor memory device according to an embodiment of the present disclosure.

Referring to FIG. 20, the semiconductor memory device receives a read command from a controller 203 at operation S310. The semiconductor memory device checks the type of the received read command at operation S330. Here, the semiconductor memory device may be any one of the first to fourth semiconductor memory devices 101 to 104 illustrated in FIG. 19. When the received read command is an SLC read command $RCMD_{SLC}$, the semiconductor memory device reads data from a physical page corresponding to the read command using a scan read voltage at operation S350. Thereafter, the read data is transferred to the controller at operation S390. In this case, the read data may be used to identify whether the corresponding page is an erased page or a programmed page, rather than user data that has been actually received from a host and stored in the semiconductor memory device.

When the received read command is a normal read command $RCMD_{NRM}$, the semiconductor memory device reads data from a physical page corresponding to the read command using a normal read voltage set at operation S370. The normal read voltage set may include at least one read level for reading data from the corresponding page in response to the read command. When memory cells in the semiconductor memory device are TLCs, the normal read command may be at least one of an LSB read command, a CSB read command, and an MSB read command.

For example, when the semiconductor memory device receives the LSB read command from the controller, the semiconductor memory device performs a read operation using first and fifth read levels R1 and R5 corresponding to the normal read voltage set for reading LSB page data at operation S370. When the semiconductor memory device receives the CSB read command from the controller, the semiconductor memory device performs a read operation using third and seventh read levels R3 and R7 corresponding to the normal read voltage set for reading CSB page data at operation S370. When the semiconductor memory device receives the MSB read command from the controller, the semiconductor memory device performs a read operation using second, fourth, and sixth read levels R2, R4, and R6 corresponding to the normal read voltage set for reading MSB page data at operation S370. In this case, the read data may be user data that is actually received from the host and stored in the semiconductor memory device.

Thereafter, the semiconductor memory device transfers the read data to the controller at operation S390.

Figure 21:
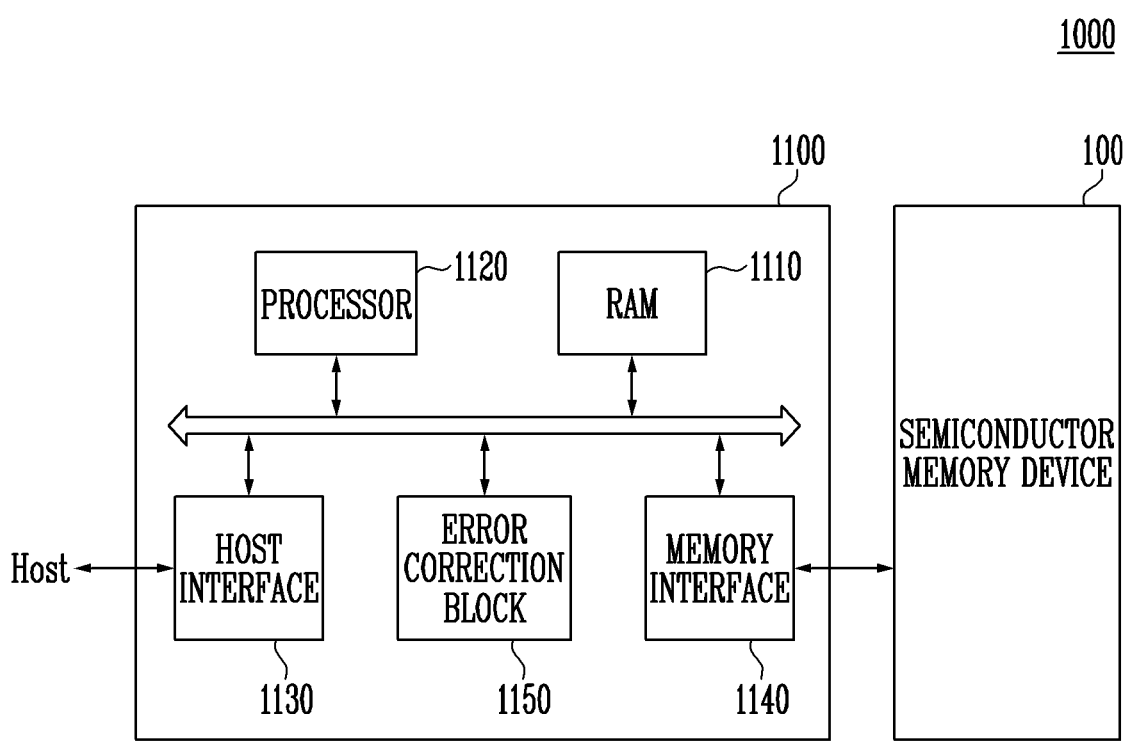
FIG. 21 is a block diagram illustrating a memory system having the semiconductor memory device of FIG. 2.

FIG. 21 is a block diagram illustrating a memory system 1000 including the semiconductor memory device 100 of FIG. 2.

Referring to FIG. 21, the memory system 1000 may include the semiconductor memory device 100 and a controller 1100. The semiconductor memory device 100 may be the semiconductor memory device described with reference to FIG. 2.

The controller 1100 is coupled to a host (Host) and the semiconductor memory device 100. The controller 1100 may access the semiconductor memory device 100 in response to a request from the host. For example, the controller 1100 may control read, write, erase, and background operations of the semiconductor memory device 100. The controller 1100 may provide an interface between the semiconductor memory device 100 and the host. The controller 1100 may run firmware for controlling the semiconductor memory device 100.

The controller 1100 includes a random access memory (RAM) 1110, a processor 1120, a host interface 1130, a memory interface 1140, and an error correction block 1150. The RAM 1110 is used as at least one of a working memory for the processor 1120, a cache memory between the semiconductor memory device 100 and the host, and a buffer memory between the semiconductor memory device 100 and the host. The processor 1120 may control overall operation of the controller 1100. In addition, the controller 1100 may temporarily store program data provided from the host during a write operation.

The host interface 1130 includes a protocol for performing data exchange between the host and the controller 1100. In an embodiment, the controller 1100 may communicate with the host through at least one of various interface protocols, such as a universal serial bus (USB) protocol, a multimedia card (MMC) protocol, a peripheral component interconnection (PCI) protocol, a PCI-express (PCI-e or PCIe) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and/or a private protocol.

The memory interface 1140 interfaces with the semiconductor memory device 100. For example, the memory interface may include a NAND interface or NOR interface.

The error correction block 1150 may detect and correct errors in data received from the semiconductor memory device 100 using an error correction code (ECC). In an embodiment, the error correction block may be provided as an element of the controller 1100.

The controller 1100 and the semiconductor memory device 100 may be integrated into a single semiconductor device. In an embodiment, the controller 1100 and the semiconductor memory device 100 may be integrated into a single semiconductor device to form a memory card, such as a personal computer memory card international association (PCMCIA), a compact flash card (CF), a smart media card (e.g., SM or SMC), a memory stick, a multimedia card (e.g., MMC, RS-MMC, or MMCmicro), a secure digital (SD) card (e.g., SD, miniSD, microSD, or SDHC), or a universal flash storage (UFS).

In another embodiment, the controller 1100 and the semiconductor memory device 100 may be integrated into a single semiconductor device to form a solid state drive (SSD). The SSD includes a storage device configured to store data in a semiconductor memory. When the memory system 1000 is used as the SSD, an operation speed of the host coupled to the memory system 1000 may be remarkably improved.

In an embodiment, the memory system 1000 may be provided as one of various elements of an electronic device such as a computer, an ultra mobile PC (UMPC), a workstation, a net-book, a personal digital assistant (PDA), a portable computer, a web tablet, a wireless phone, a mobile phone, a smartphone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, a radio frequency identification (RFID) device, or one of various elements for forming a computing system.

In an embodiment, the semiconductor memory device 100 or the memory system 1000 may be mounted in various types of packages. For example, the semiconductor memory device 100 or the memory system 1000 may be packaged and mounted in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline integrated circuit Package (SOIC), Shrink Small Outline Package (SSOP), Thin Small Outline Package (TSOP), System In Package (SIP), Multi Chip Package (MCP), Wafer-level Fabricated Package (WFP), or Wafer-Level Processed Stack Package (WSP).

Figure 22:
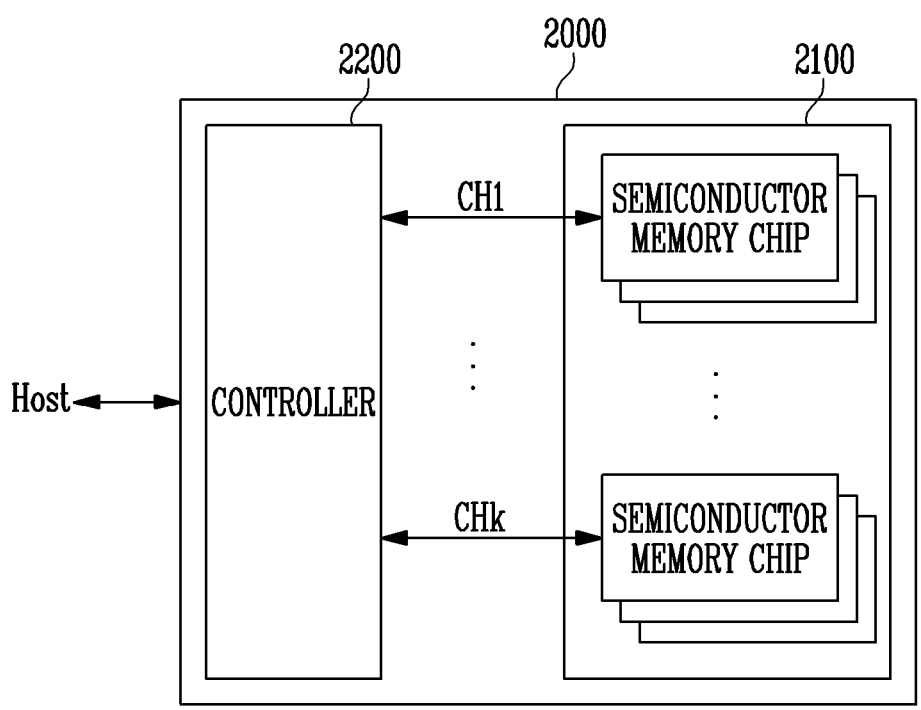
FIG. 22 is a block diagram illustrating an exemplary application of the memory system of FIG. 21.

FIG. 22 is a block diagram illustrating an example of application of the memory system of FIG. 21.

Referring to FIG. 22, the memory system 2000 may include the semiconductor memory device 2100 and a controller 2200. The semiconductor memory device 2100 may include a plurality of semiconductor memory chips. The semiconductor memory chips are divided into a plurality of, e.g., k, groups.

In FIG. 22, it is illustrated that the k groups communicate with the controller 2200 through first to k-th channels CH1 to CHk, respectively. Each semiconductor memory chip may be configured and operated in the same manner as the semiconductor memory device 100 described with reference to FIG. 2.

Each group may communicate with the controller 2200 through one common channel. The controller 2200 may have the same configuration as the controller 1100 described with reference to FIG. 21, and may control the plurality of memory chips of the semiconductor memory device 2100 through the plurality of channels CH1 to CHk.

Figure 23:
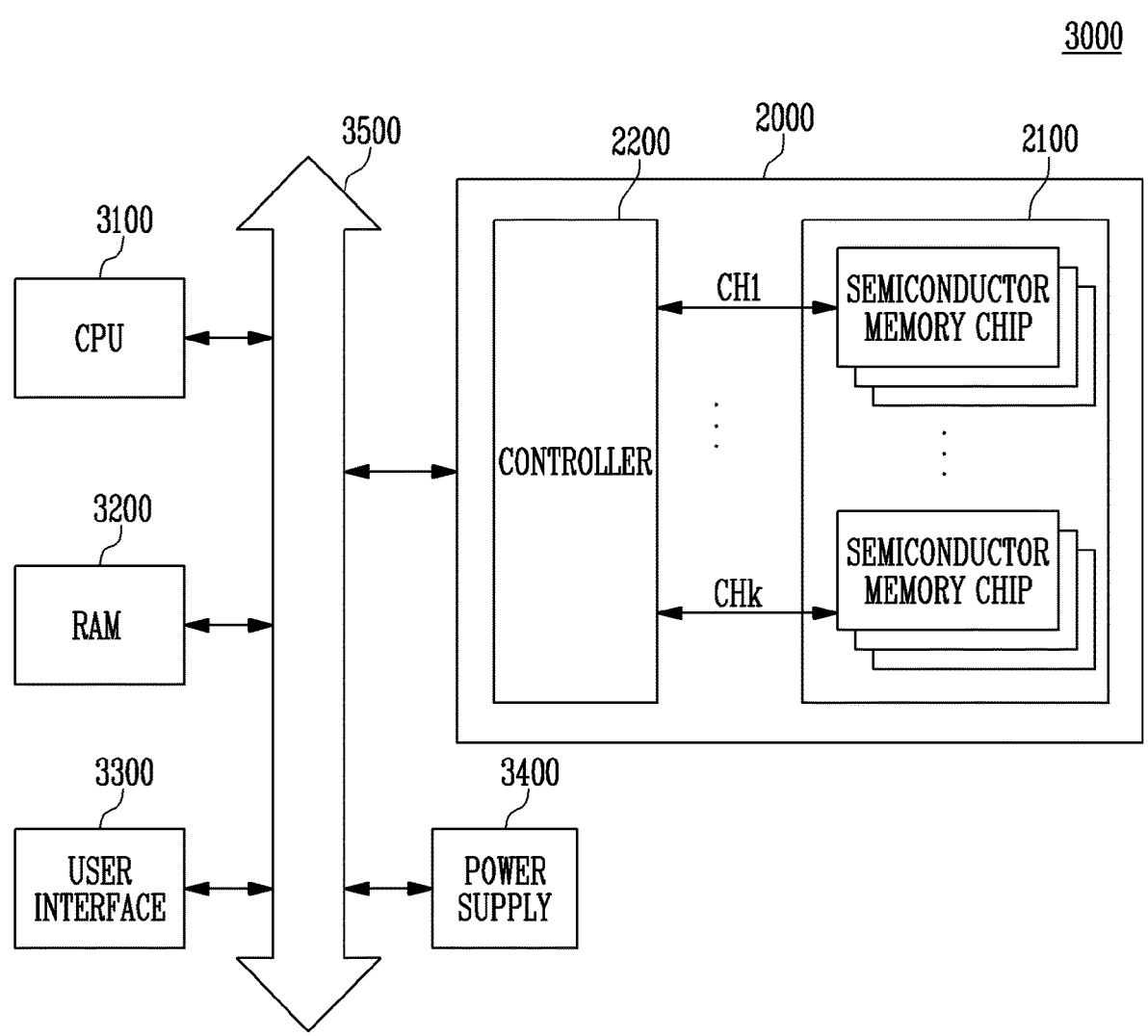
FIG. 23 is a block diagram illustrating a computing system including the memory system of FIG. 22.

FIG. 23 is a block diagram illustrating a computing system 3000 including the memory system described with reference to FIG. 22.

Referring to FIG. 23, the computing system 3000 includes a central processing unit (CPU) 3100, a random access memory (RAM) 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 23, a semiconductor memory device 2100 is illustrated as being coupled to the system bus 3500 through the controller 2200. However, the semiconductor memory device 2100 may be directly coupled to the system bus 3500. Here, the function of the controller 2200 may be performed by the CPU 3100 and the RAM 3200.

In FIG. 23, the memory system 2000 described with reference to FIG. 22 is illustrated as being provided. However, the memory system 2000 may be replaced with the memory system 1000 described with reference to FIG. 21. In an embodiment, the computing system 3000 may include both the memory systems 1000 and 2000 described with reference to FIGS. 21 and 22.

The present disclosure may provide a semiconductor memory device having improved operation speed, a controller, and a method of operating the semiconductor memory device and the controller.

While the present invention has been illustrated and described in connection with various embodiments, those skilled in the art will recognize that various modifications may be made to any of the disclosed embodiments within the spirit and scope of the disclosure. The present invention encompasses all such modifications that fall within the scope of the claims.

What is claimed is:

1. A method of operating a controller of a memory system and that controls a semiconductor memory device including a plurality of memory blocks, the method comprising:
   sensing a power-on state of the memory system; and
   performing an erased block scan operation on the plurality of memory blocks using a scan read voltage, based on sensing that the memory system is in the power-on state,
   wherein it is determined whether each of the plurality of memory blocks is an erased block or not, by the erased block scan operation,
   wherein each of memory cells in the plurality of memory blocks stores at least two bits of data, and
   wherein the scan read voltage enables an erase state and a program state of the memory cells to be distinguished from each other.

2. The method according to claim 1, wherein performing the erased block scan operation on the plurality of memory blocks using the scan read voltage comprises:
   selecting a memory block on which the erased block scan operation has not been performed from among the plurality of memory blocks;
   controlling the semiconductor memory device so that a single-level cell (SLC) read operation is performed on the selected memory block using the scan read voltage; and
   updating a block state of the selected memory block based on a result of the SLC read operation.

3. The method according to claim 2, wherein controlling the semiconductor memory device so that the SLC read operation is performed on the selected memory block using the scan read voltage comprises:

controlling the semiconductor memory device so that data stored in a plurality of pages in the selected memory block are sequentially read using the scan read voltage; and analyzing the read data.

4. The method according to claim 3, further comprising: determining the selected memory block to be a programmed block in response to a result of the analyzing indicating that all pages in the selected memory block are programmed pages.

5. The method according to claim 3, further comprising: determining the selected memory block to be an erased block in response to a result of the analyzing indicating that all pages in the selected memory block are erased pages.

6. The method according to claim 3, further comprising: determining the selected block to be an open block in response to a result of the analyzing indicating that both a programmed page and an erased page are included in the selected memory block.

7. A method of operating a semiconductor memory device including a plurality of memory blocks, each of which includes a plurality of memory cells, each storing at least two bits of data, the method comprising:
receiving a read command from a controller;
checking a type of the received read command; and
performing a data read operation on a page corresponding to the read command by selectively using a scan read voltage or a normal read voltage set based on the type of the read command,
wherein it is determined whether each of the plurality of memory blocks is an erased block or not, by the data read operation on the page using the scan read voltage.

8. The method according to claim 7, further comprising: transferring the read data to the controller.

9. The method according to claim 7, wherein performing the data read operation on the page corresponding to the read command by selectively using the scan read voltage or the normal read voltage set based on the type of the read command comprises:
reading data from a page corresponding to the read command using the scan read voltage in response to a determination indicating that the type of the read command is a single-level cell (SLC) read command.

10. The method according to claim 9, wherein the scan read voltage enables an erase state and at least one program state of the memory cells to be distinguished from each other.

11. The method according to claim 7, wherein performing the data read operation on the page corresponding to the read command by selectively using the scan read voltage or the normal read voltage set based on the type of the read command comprises:
reading data from a page corresponding to the read command using the normal read voltage set in response to a determination indicating that the type of the read command is a normal read command.

12. The method according to claim 11, wherein:
each of the plurality of memory cells stores two bits of data, and
the normal read voltage set is at least one of a first read voltage set for reading least significant bit (LSB) page data stored in the selected page and a second read voltage set for reading most significant bit (MSB) page data stored in the selected page.

13. The method according to claim 11, wherein:
each of the plurality of memory cells stores three bits of data, and
the normal read voltage set is at least one of a first read voltage set for reading least significant bit (LSB) page data stored in the selected page, a second read voltage set for reading central significant bit (CSB) page data stored in the selected page, and a third read voltage set for reading most significant bit (MSB) page data stored in the selected page.

14. A memory system, comprising:
a semiconductor memory device including a plurality of memory blocks, each of which includes a plurality of memory cells, each storing at least two bits of data; and
a controller configured to control an operation of the semiconductor memory device,
wherein the controller controls the semiconductor memory device so that, in response to sensing of a power-on state of the memory system, an erased block scan operation is performed on the plurality of memory blocks by using a scan read voltage that enables an erase state and a program state of each of the memory cells to be distinguished from each other,
wherein it is determined whether each of the plurality of memory blocks is an erased block or not, by the erased block scan operation.

15. The memory system according to claim 14, wherein the controller controls the semiconductor memory device so that the erased block scan operation is performed by transferring a single-level cell (SLC) read command, which is different than a normal read command, to the semiconductor memory device.

16. The memory system according to claim 14, wherein the controller selects a memory block on which the erased block scan operation has not been performed from among the plurality of memory blocks, sequentially generates a plurality of SLC read commands corresponding to a plurality of pages in the selected memory block, and transfers the SLC read commands to the semiconductor memory device.

17. The memory system according to claim 16, wherein the controller updates a block state of the selected memory block based on read data received in response to the plurality of SLC read commands for the selected memory block.

18. The memory system according to claim 15, wherein, in response to the SLC read command, the semiconductor memory device reads data from a page corresponding to the SLC read command using the scan read voltage.

* * * * *